(12) United States Patent
Lowry

(10) Patent No.: US 7,316,936 B2
(45) Date of Patent: Jan. 8, 2008

(54) LASER DECAPSULATION METHOD

(75) Inventor: Robert K. Lowry, Melbourne Beach, FL (US)

(73) Assignee: Intersil Americans Inc., Milpitas, CA (US)

( * ) Notice: Subject to any disclaimer, the term of this patent is extended or adjusted under 35 U.S.C. 154(b) by 0 days.

(21) Appl. No.: 11/616,617

(22) Filed: Dec. 27, 2006

(65) Prior Publication Data
US 2007/0111337 A1    May 17, 2007

Related U.S. Application Data

(60) Continuation of application No. 09/949,736, filed on Sep. 10, 2001, now Pat. No. 7,166,186, which is a division of application No. 09/307,896, filed on May 10, 1999, now Pat. No. 6,335,208.

(51) Int. Cl.
*G01R 31/26* (2006.01)
(52) U.S. Cl. .................. 438/15; 438/940; 257/E21.521
(58) Field of Classification Search .................. 438/4
See application file for complete search history.

(56) References Cited

U.S. PATENT DOCUMENTS

| | | | |
|---|---|---|---|
| 4,052,603 A | 10/1977 | Karlson | |
| 5,049,406 A | 9/1991 | Geittner et al. | |
| 5,182,230 A | 1/1993 | Donelon et al. | |
| 5,254,832 A | 10/1993 | Gartner et al. | |
| 5,281,798 A | 1/1994 | Hamm et al. | |
| 5,423,931 A * | 6/1995 | Inoue et al. | 156/94 |
| 5,424,254 A | 6/1995 | Damiot | |
| 5,643,472 A | 7/1997 | Engelsberg et al. | |
| 5,700,697 A | 12/1997 | Dlugokecki | |
| 5,725,914 A | 3/1998 | Opower | |
| 5,736,464 A | 4/1998 | Opower | |
| 5,817,243 A | 10/1998 | Shaffer | |
| 5,824,569 A | 10/1998 | Brooks et al. | |
| 5,961,860 A * | 10/1999 | Lu et al. | 219/121.65 |
| 6,043,100 A * | 3/2000 | Weaver et al. | 438/4 |
| 6,048,588 A | 4/2000 | Engelsberg | |
| 6,140,604 A | 10/2000 | Somers et al. | |
| 6,329,272 B1 | 12/2001 | Gagnon et al. | |
| 6,335,208 B1 | 1/2002 | Lowry | |
| 7,166,186 B2 | 1/2007 | Lowry | |

FOREIGN PATENT DOCUMENTS

| | | |
|---|---|---|
| FR | 2731637 | 9/1996 |
| GB | 2177965 | 2/1987 |
| JP | 63032957 A * | 2/1988 |
| WO | 8607492 | 12/1986 |

\* cited by examiner

*Primary Examiner*—Stephen W. Smoot
(74) *Attorney, Agent, or Firm*—Scott V. Lundberg; Fogg & Powers LLC

(57) ABSTRACT

A decapsulation apparatus 100 has a laser 8 that removes plastic encapsulant from a device 24. Chamber 20 is sealed. Exhaust port 9 removes debris and fumes. The device 24 is positioned and scanned using an X, Y table 2. A hinged end 4 rotates the device to an acute angle of incidence with respect to a laser 8. Endpoint detector 10 senses the exposed integrated circuit and moves or shuts down the laser 8.

18 Claims, 2 Drawing Sheets

LASER DECAPSULATION METHOD

CROSS-REFERENCE TO RELATED APPLICATIONS

This Application is a continuation application of U.S. patent application Ser. No. 09/949,736, filed Sep. 10, 2001, now U.S. Pat. No. 7,166,186; which is a divisional application of U.S. patent application Ser. No. 09/307,896, filed May 10, 1999, now U.S. Pat. No. 6,335,208.

BACKGROUND

This invention relates generally to an apparatus and method for removing plastic compounds that encapsulate integrated circuits and particularly, to a laser-equipped apparatus and method for decapsulating plastic encapsulated integrated circuits.

The vast majority of integrated circuits are packaged in plastic resins including but not limited to biphenyl, ortho-cresol novolac, and dicyclopentadienyl types. The plastic package seals the enclosed integrated circuit from the external environment, including moisture and dust. The resin contains fillers such as silica or other insulating materials to enhance the physical and mechanical properties of the package. The integrated circuits are encapsulated using a transfer molding process. During that process a solid charge of resin is melted and then forced under pressure into a multi cavity mold that contains a number of integrated circuits. One mold may contain tens or hundreds of integrated circuits. The size of the molded integrated circuits varies in length, width and height. As the resins cool, their molecules cross-link into a solid resin. Some devices using the standard dual-in-line package are several millimeters thick. Other small outline packages are a millimeter in thickness.

There are a number of reasons for removing the plastic encapsulant from finished Integrated circuits. One reason is to monitor the manufacturing process. In most mass manufacturing processes, samples of finished product are often taken and analyzed to check whether or not the finished product is made to the manufacturing specifications. When one or more devices fail, it is desirable to analyze those failed devices to detect process flaws so that the flaws can be corrected. Some devices are also reverse engineered in order to discover how the device is constructed.

Current techniques for removing the plastic are time consuming and environmentally unfriendly. One acid etching technique uses fuming nitric or sulfuric acid. That technique can take several hours or more to remove the plastic, and the spent chemicals must be properly disposed of. In addition, these harsh chemicals come in contact with the surface of the integrated chip being exposed, which may chemically remove foreign substances or contaminants residing between the top of the die and the mold compound which will subsequently not be detected in failure analysis. Plasma etching may be used but it is slow and also leaves undesired residues. As such, there is a long felt and unfulfilled need for a faster process that is environmentally friendly and less disruptive to the top surface of the integrated circuit chip.

SUMMARY

The invention eliminates hazardous acid waste and provides a faster decapsulation process which is less disruptive to the top-of-die surface. The invention provides an apparatus and method for removing plastic encapsulant using a tunable laser. A chamber has a stage for holding the integrated circuit during decapsulation. The stage is an X,Y table that comprises rods so that encapsulant debris may fall between the rods. Below the stage is a dust bin for collecting the debris. A hinge on the table lets the operator adjust the angle of incidence of the laser beam on the surface of the device under test.

A laser outside the chamber shines its beam through a window or other suitable optical opening onto the surface of the device under test. The laser beam is tunable in frequency and intensity to suitable settings for removing the encapsulant. The laser beam is generated by a YAG or infrared laser or any other laser suitable for breaking the cross linked bonds of the encapsulant without damaging the integrated circuit.

The decapsulation process is controlled by a computer that includes a microprocessor or digital signal processor, suitable memory, an application program for operating the apparatus and suitable sensors. One sensor is an endpoint detector. It is focused on the integrated circuit to detect reflected light. Where the plastic is removed, the beam strikes the integrated circuit and the amplitude and frequency of the reflected light changes. The endpoint detector senses those changes. In response to a signal indicating that the integrated circuit is exposed, the computer shuts down the laser beam or moves the laser beam to a new location.

The apparatus has a sealed chamber. Fumes generated by decapsulation are exhausted through a suitable fan or blower-operated exhaust port. A cleaning gas such as nitrogen or compressed air is directed at the surface of the integrated circuit to remove dust and debris. The removed dust and debris are either exhausted or fall into the dust bin.

DRAWINGS

DETAILED DESCRIPTION

Figure 1:
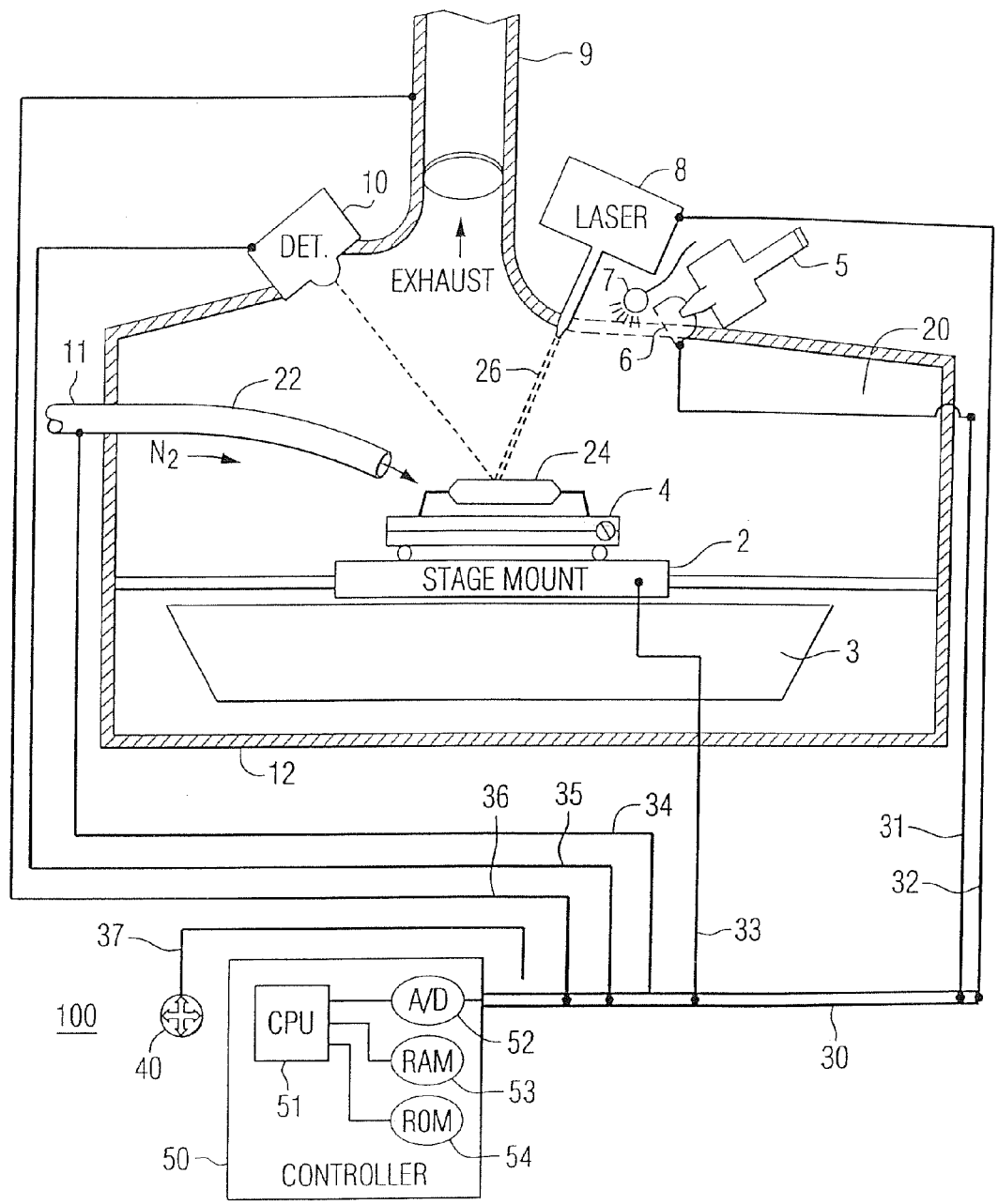
FIG. 1 is a sectional elevation view of the invention showing the integrated circuit oriented at a near normal angle to the laser beam.

Turning to FIG. 1, there is shown a decapsulation apparatus 100 that comprises a chamber wall 12 that encloses and seals a chamber 20. The chamber 20 has a clean gas inlet 11 with a conduit 22 that directs a stream of clean gas, such as nitrogen or compressed air at a device under test (DUT), i.e., integrated circuit 24. Chamber 20 also has an exhaust port 9 for removing fumes and dust particles from the chamber. Within the chamber is a stage 2 that is disposed over a dust bin 3. The dust bin 3 catches dust and debris that are generated by the laser striking the plastic resin on the DUT 24.

A laser 8 is mounted on the outside wall 12 of the chamber 20. The laser directs a laser beam 26 toward the DUT 24. The laser 8 is any suitable laser, such as a YAG or an infrared laser. The laser 8 has its frequency and its intensity (power) tunable for removing plastic encapsulant from the DUT 24 without causing damage to the encapsulated integrated circuit. The laser beam 26 passes through an optical opening or window (not shown) in the wall 12 of the chamber 20. The interior of the chamber 20 is illuminated by a suitable light 7. Operation of the laser on the DUT 24 is observed through a microscope 5. This is also mounted on wall 12. The microscope 5 has a shutter 6 that may be manually or automatically operated as hereinafter described. Light reflected from the surface of the DUT 24 is detected by endpoint detector 10. The endpoint detector 10 senses the amplitude or frequency or both of the reflected light. The endpoint detector is any suitable photosensitive device that responds to changes in sensed frequency or intensity.

Figure 2:
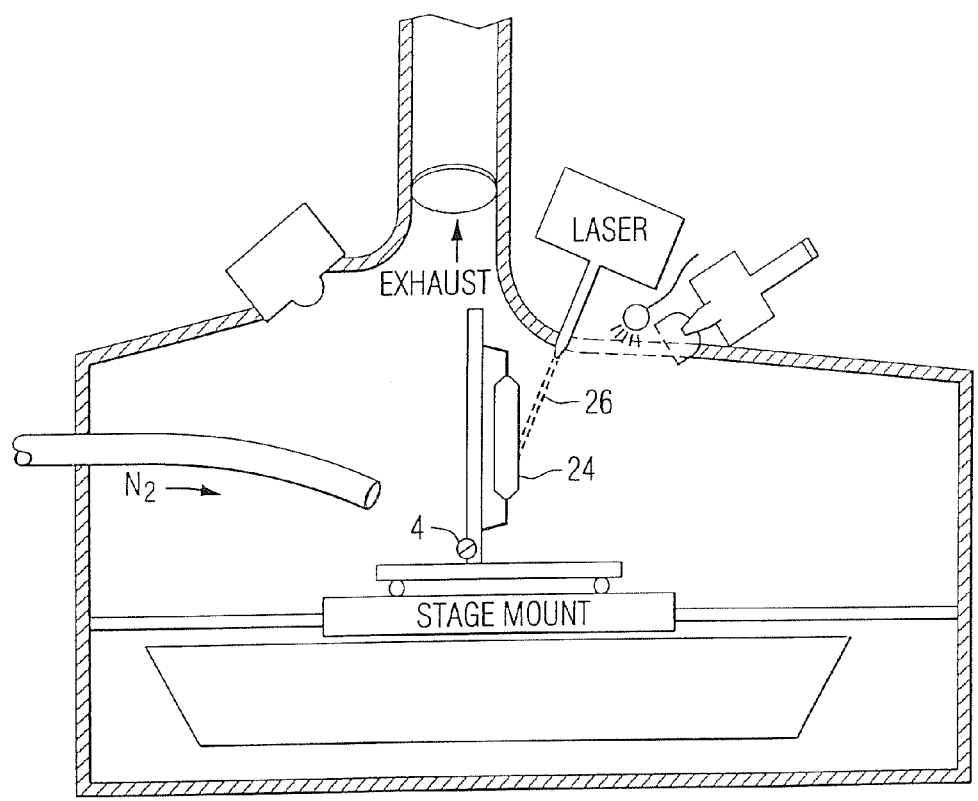
FIG. 2 is a further view showing the integrated circuit oriented at an acute angle of incidence to the laser beam.

The stage 2 is an X,Y positioning table. It is desirable that the stage be made of rods or a perforated table so that dust and debris removed from the DUT 24 falls through the stage and the stage mount into the dust bin 3. Such X,Y positioning tables are well known in the art. They maybe operated using piezoelectric operators, linear magnetic motors, or lead screws. As shown in FIG. 1, the DUT 24 is disposed at substantially a normal angle to the laser beam 26. The stage is hinged at one end 4 so that the DUT 24 may be rotated to a substantially vertical position as shown in FIG. 2. In its vertical position, the laser beam 26 has an acute angle of incidence with the surface of the DUT 24. That particular position is useful when it is desired to leave a thin layer of encapsulant on the surface of the integrated circuit. Leaving such a thin layer is often desired during failure analysis to detect contaminants on the surface of the encapsulated DUT 24.

The apparatus 100 may be manually operated or automatically operated or may be semiautomatically operated. For automatic and semiautomatic operation, the apparatus 100 is provided with a controller 50. The controller 50 includes a CPU 51 which may be a microprocessor or a digital signal processor. The CPU 51 communicates with a random access memory 53 and a read-only memory 54. Suitable operating software and application software are stored in the RAM 53 or ROM 54. The CPU 51 controls operations of the various components of the apparatus 100 via the control bus 30 and the control lines 31-37 that are respectively connected to the microscope shutter 6, laser 8, stage 2, clean gas inlet 11, endpoint detector 10, exhaust port 9, and joy stick 40. By manual, automatic or semiautomatic operation, the operator may selectively operate any one of the controlled components, move the stage to its desired X,Y position, and rotate the top platform of the stage to its desired Z axis orientation.

The following wavelengths in the infrared range are especially applicable: 725-900 cm-1, 1150-1300 cm-1, 1400-1500 cm-1 and 1600-1750 cm-1. These wavelength ranges were determined from IR chemical analysis of the mold compound resins. See "Identifying Plastic Encapsulant Materials by Pyrolysis Infrared Spectrophotometry", R. K. Lowry, K. L. Hanley, Proceedings, 1998 Intl Symposium for Testing and Failure Analysis, November, 1998, pp. 399-401. It is these wavelength ranges in particular where there is significant absorption of IR energy at the molecular level by plastic resins. An incident beam tuned for maximized power in these energy ranges begins to promote molecular rearrangement and ultimately decompositional breakdown of polymerized resin molecules. Any tuned laser operating in these ranges promotes breakdown not just by thermal heating the material (which almost any incident laser energy with enough power could provide) but also by chemical decomposition. This promotes breakdown in a "material-specific" way, so that excessive heating via straightforward but less-controllable thermal decomposition can be avoided.

In operation, a DUT 24 is placed or otherwise mounted on the top of the stage 2. While the embodiment shown in FIG. 1 includes only a single device, those skilled in the art will appreciate that multiple devices may be mounted on the stage. Either manually or with the assistance of controller 50, the stage 2 is positioned in an X,Y plane relative to the laser beam 26, of laser 8. Laser 8 is under control of the controller 50. Laser 8 may be any suitable laser that has its amplitude and frequency tuned and controlled by controller 50. Such suitable lasers include YAG lasers, as well as infrared lasers. It is desired to use a laser with a suitable power and frequency for breaking the cross-linked polymeric bonds of the plastic resin that encapsulates the DUT 24. The laser may be operated at a relatively low level to provide a target beam that strikes the stage and the DUT 24. The operator may then position the stage by using a joy stick device 40 and the microscope 5. In the preferred embodiment, the stage is moved to initially place the laser on one of the corners of the DUT 24. Once the starting point for the laser has been selected, then the stage moves in a raster pattern along a first axis, steps transverse to the first axis at least the width of the beam, and then reverses direction and travels back along the first axis. In this manner, the beam 26 raster-scans across the DUT 24. Of course, if desired, the laser beam 26 may be raster-scanned using optical methods, including prisms and/or mirrors that are selectively moved to sweep the beam across the surface of the DUT 24.

When the beam 26 is operated at its effective frequency and intensity, the plastic encapsulant is removed from the DUT 24. The removal process creates a cloud of debris and fumes. The fumes and some lighter debris particles are withdrawn from the chamber 20 via the exhaust port 9. The heavier debris particles fall through the rods or holes in the stage 2 and are captured in the dust bin 3. Some of the dust may settle onto the DUT 24. Clean gas 22 drives the dust away from the DUT 24. The clean gas 22 includes any suitable gas, such as nitrogen or air for dispersing the dust particles away from the surface of the DUT 24. Such dispersal permits the operator to view the DUT in process and removes particles from the immediate path of the laser so that the encapsulant is more effectively removed.

Decapsulation may be carried out automatically. During automatic decapsulation, the laser is operated until the endpoint detector 10 detects a change in the amplitude and/or frequency of light reflected from the DUT 24. When the integrated circuit is uncovered, the reflected light changes its frequency. The intensity of reflected light may also change. The DUT detects these changes and provides a signal via signal and control line 35 to the controller 50.

Controller 50 receives and sends signals on control and sensor bus 30 via an A-to-D and D-to-A converter 52. The control and sensing signals are analog signals. Thus, it is necessary to convert the analog signals to digital signals so that they can be understood by the CPU 51. If the CPU 51 is a DSP, the DSP has a built-in A-to-D and D-to-A converter.

Controller 50 receives the signal from the endpoint detector 10. When the endpoint detector 10 signals that the integrated circuit is uncovered, the controller 50 advances the stage to the next position to continue removing encapsulant. As such, for a given beam width, the laser is focused on the DUT 24 until the underlying integrated circuit is exposed. Upon detection of the exposed integrated circuit, the stage is moved in a continuous or stepwise pattern to subsequent positions.

As indicated above, it is also possible to manually operate the apparatus or to semi-automatically operate the apparatus. For example, it is often desired to provide one or more pinholes down to the surface of the integrated circuit. Those holes can be provided by selectively removing encapsulant using the laser and the endpoint detector.

Having thus described the preferred embodiment of the invention, those skilled in the art will appreciate that further changes, modifications, additions and omissions may be made to that embodiment without departing from the spirit and scope of the appended claims.

What is claimed is:

1. A method of manufacturing integrated circuits, the method comprising;
   forming encapsulated integrated circuits; and
   sampling select integrated circuits to verify if the finished integrated circuits are made to manufacturing specifications by selectively removing portions of the encapsulation with a laser that is suitable for breaking cross linked bonds of the encapsulant without damaging the integrated circuits, wherein a thin layer of encapsulant is left on at least one portion of at least one of the sampled integrated circuits.

2. The method of claim 1, wherein selectively removing portions of the encapsulant of the select sampled integrated circuits further comprises:
   monitoring amplitude and frequency of the laser light reflected of each selected integrated circuit; and
   when a change in at least one of the amplitude and frequency is detected, moving each selected integrated circuit.

3. The method of claim 2, wherein moving each selected integrated circuit further comprises:
   advancing a stage upon which the select integrated circuit is mounted on.

4. The method of claim 1, wherein selectively removing portions of the encapsulant of the select sampled integrated circuits with a laser further comprises:
   using a laser with wavelengths in the infrared range that includes at least one range of 725-900 cm-1, 1150-1300 cm-1, 1400-1500 cm-1 and 1600-1750 cm-1.

5. The method of claim 1, wherein selectively removing portions of the encapsulation of the select sampled integrated circuits with a laser further comprises:
   using at least one of a YAG laser and an infrared laser.

6. The method of claim 1, wherein selectively removing portions of the encapsulation of the select sampled integrated circuits further comprises:
   changing an angle of incident of the laser by rotating a stage upon which the integrated circuits are mounted.

7. The method of claim 1, further comprising:
   testing the thin layer of encapsulant for contaminates.

8. The method of claim 1, wherein selectively removing portions of the encapsulation of the select sampled integrated circuits further comprises:
   removing debris caused by the removal of select portions of encapsulate by at least one of using a flow of gas to direct the debris away from the integrated circuits and capturing the debris in a dust bin.

9. A method of manufacturing integrated circuits, the method comprising:
   forming integrated circuits with a manufacturing process, wherein each integrated circuit is encapsulated to protect the integrated circuit from environmental factors;
   selecting certain formed integrated circuits;
   placing each selected integrated circuit on a stage in an enclosure;
   directing a laser beam having a select wavelength on a select portion of the encapsulant to remove the select portion of encapsulant, wherein with at least one of the select integrated circuits the select removed portion of encapsulant has a depth, the depth being less than a thickness of the encapsulant;
   monitoring the laser beam reflected off of the integrated circuit;
   moving the stage based at least in part on the monitored reflected laser beam;
   terminating the laser beam based at least in part on the monitored reflect laser beam; and
   testing the selected integrated circuits with the select portion of encapsulant removed to verify that the integrated circuits are formed to manufacture specifications.

10. The method of claim 9, further comprising:
    exhausting debris from the enclosure.

11. The method of claim 10, wherein exhausting debris from the stage further comprises:
    directing a flow of gas to disperse the debris away from the integrated circuit.

12. The method of claim 9, further comprising:
    catching debris particles in a dust bin.

13. The method of claim 9, further comprising:
    testing for contaminates in a thin layer of encapsulant left on the at least one select integrated circuit having the select removed portion with a depth less than the depth of the encapsulant.

14. A manufacturing method of removing encapsulant from an integrated circuit; the method comprising:
    placing an integrated circuit on a stage in an enclosure;
    directing a laser beam on the encapsulation of the integrated circuit, wherein the laser beam has a wavelength that is suitable for breaking cross linked bonds of the encapsulant without damaging the underlying integrated circuit;
    removing at least one select portion of the encapsulant with the laser beam; and
    capturing debris particles in a dust bin.

15. The method of claim 14, further comprising:
    monitoring the laser beam reflected off of the integrated circuit; and
    based at least in part on the monitored laser beam, doing at least one of moving the stage and terminating the laser beam.

16. The method of claim 14, further comprising:
    after the removing the at least one select portion of the encapsulant, verifying the integrated circuit is made to manufacturing specifications.

17. The method of claim 14, further comprising:
    directing a flow of gas to move the debris away from the integrated circuit.

18. The method of claim 14, further comprising:
    leaving a thin layer of encapsulant at the at least one select portion, and
    testing for contaminates in the thin layer of encapsulant.

* * * * *